(12) United States Patent
Lee et al.

(10) Patent No.: US 9,492,840 B2
(45) Date of Patent: Nov. 15, 2016

(54) METHODS OF REMOVING SURFACE LIGAND COMPOUNDS

(71) Applicant: SAMSUNG ELECTRONICS CO., LTD., Suwon-si, Gyeonggi-do (KR)

(72) Inventors: Seung Yeon Lee, Seoul (KR); Jun Ho Lee, Hwaseong-si (KR); Kyungsang Cho, Gwacheon-si (KR); Young Suk Jung, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 10 days.

(21) Appl. No.: 14/556,613

(22) Filed: Dec. 1, 2014

(65) Prior Publication Data

US 2015/0151338 A1     Jun. 4, 2015

(30) Foreign Application Priority Data

Dec. 2, 2013  (KR) .................. 10-2013-0148745
Nov. 27, 2014 (KR) .................. 10-2014-0167145

(51) Int. Cl.
*B05D 1/02*    (2006.01)
*C01B 19/00*   (2006.01)
*B22F 1/00*    (2006.01)

(52) U.S. Cl.
CPC ............. *B05D 1/02* (2013.01); *B22F 1/0018* (2013.01); *B22F 1/0085* (2013.01); *B22F 1/0088* (2013.01); *C01B 19/002* (2013.01);
(Continued)

(58) Field of Classification Search
CPC ... B22F 1/0018; B22F 1/0085; B22F 1/0088
See application file for complete search history.

(56) References Cited

U.S. PATENT DOCUMENTS 5,378,624 A *  1/1995  Berenson ............... C12Q 1/24
                                                  435/239
7,879,153 B1    2/2011  Seo et al.
(Continued)

FOREIGN PATENT DOCUMENTS

JP    2008230876 A    10/2008
JP    2009161820 A     7/2009
(Continued)

OTHER PUBLICATIONS

Dong Yu et al., "n-Type Conducting CdSe Nanocrystal Solids", Science, vol. 300, May 23, 2003, pp. 1277-1280.
(Continued)

*Primary Examiner* — Xiao Zhao
(74) *Attorney, Agent, or Firm* — Cantor Colburn LLP

(57) ABSTRACT

A method for removing an organic ligand from a surface of a particle including:
  obtaining a particle having an organic ligand disposed on a surface thereof;
  contacting the particle with an alkylammonium salt represented by Chemical Formula 1:

$NR'_4{}^+A^-$   Chemical Formula 1 wherein groups R' are the same or different and are each independently hydrogen or a C1 to C20 alkyl group, provided that at least one group R' is an alkyl group, and A is a hydroxide anion, a halide anion, a borohydride anion, a nitrate anion, a phosphate anion, or a sulfate anion; and
  heat-treating the particle to carry out a reaction between the alkylammonium salt and the organic ligand.

25 Claims, 14 Drawing Sheets

(52) U.S. Cl.
CPC ......... *C01B19/007* (2013.01); *C01P 2002/82* (2013.01); *C01P 2002/89* (2013.01); *C01P 2004/04* (2013.01); *C01P 2004/64* (2013.01); *C01P 2006/40* (2013.01); *Y10T 428/256* (2015.01)

(56) References Cited

U.S. PATENT DOCUMENTS

| | | |
|---|---|---|
| 8,435,635 B2 | 5/2013 | Alivisatos et al. |
| 2011/0045203 A1 | 2/2011 | Grovola et al. |
| 2011/0177340 A1 | 7/2011 | Alivisatos et al. |
| 2011/0226990 A1 | 9/2011 | Glennon et al. |
| 2012/0149560 A1 | 6/2012 | Lee et al. |
| 2012/0160266 A1 | 6/2012 | Thompson |
| 2012/0168692 A1 | 7/2012 | Son, II et al. |

FOREIGN PATENT DOCUMENTS

| | | |
|---|---|---|
| KR | 1020110028750 A | 3/2011 |
| KR | 1020110098513 A | 9/2011 |
| KR | 1020110100230 A | 9/2011 |
| KR | 1020120063925 A | 6/2012 |

OTHER PUBLICATIONS

Greenham et al., "Charge separation and transport in conjugated-polymer/semiconductor-nanocrystal composites studied by photoluminescence quenching and photoconductivity", Physical Review B, vol. 54, No. 24, Dec. 15, 1996-II, 17 628-17 637.

Jose A. Lopez-Sanchez, et al.; "Facile removal of stabilizer-ligands from supported gold nanoparticles"; Nature Chemistry vol. 3, Jul. 2011; Macmillan Publishers Limited; Jun. 5, 2011; DOI: 10.1038/NCHEM.1066; pp. 551-556.

Lim et al., "Preparation of Highly Luminescent Nanocrystals and Their Application to Light-Emitting Diodes**", Adv. Mater., 2007, 19, pp. 1927-1932.

Menard et al., "Preparation of TiO2-supported Au nanoparticle catalysts from a Au13 cluster precursor: Ligand removal using ozone exposure versus a rapid thermal treatment", Journal of Catalysis , 243, 2006, pp. 64-73.

Wagener et al., "How Citrate Ligands Affect Nanoparticle Adsorption to Microparticle Supports", Langmuir, 2012, 28, pp. 6132-6140.

Zhang et al., "Surfactant Ligand Removal and Rational Fabrication of Inorganically Connected Quantum Dots", Nano Lett., 2011, 11, pp. 5356-5361.

\* cited by examiner

METHODS OF REMOVING SURFACE LIGAND COMPOUNDS

CROSS-REFERENCE TO RELATED APPLICATIONS

This application claims priority to and the benefit of Korean Patent Application Nos. 10-2013-0148745 and 10-2014-0167145 filed on Dec. 2, 2013, and Nov. 27, 2014, respectively, and all the benefits accruing therefrom under 35 U.S.C. §119, the contents of which are incorporated herein in their entirety by reference.

BACKGROUND

1. Field

A process for removing a surface ligand compound is disclosed.

2. Description of the Related Art

When a small entity (e.g., a particle) having a nano-size or a micron-size is prepared, an organic compound capable of coordinating to a surface of the entity (also called as "an organic ligand") is used for controlling a size or a crystal type thereof. The organic ligand may be often used for preventing aggregation of the particles.

However, the organic ligand coordinated to the surface of the particle may have a detrimental effect on performance of that particle. Thus, developing a technology for removing (or substituting) the ligand from the particle is necessary. In addition, the removal of the surface-coordinated organic ligand would be necessary for analysis of the prepared particles or the ligand itself. Therefore, it is desirable to develop a technology enabling the removal or separation of the organic ligand in a simple manner within a short time.

SUMMARY

An embodiment is directed to a method of easily removing an organic compound coordinating the surface of a nano- or micron-sized particle without having any detrimental effect on the particles.

According to an embodiment, a method of removing an organic ligand from a surface of a particle is provided, the method including:

obtaining a particle having an organic ligand disposed on a surface thereof;

contacting the particle with an alkylammonium salt represented by Chemical Formula 1:

 $NR'_4{}^+A^-$     Chemical Formula 1 wherein groups R' are the same or different and are each independently hydrogen or a C1 to C20 alkyl group, provided that at least one group R' is an alkyl group, and A is a hydroxide anion, a halide anion, a borohydride anion, a nitrate anion, a phosphate anion, or a sulfate anion; and heat-treating the particle to initiate and carry out a reaction between the alkylammonium salt and the organic ligand.

The contacting of the particle with the alkylammonium salt may include dissolving the alkylammonium salt in a solvent to prepare a solution and applying the solution to the particle.

The heat-treating of the particle may include removing a reaction product of the alkyl ammonium salt and the organic ligand.

The method may further include washing the heat-treated particle with a solvent.

The particle may include a metal, a semiconductor nanocrystal, a ceramic material, a carbon nanotube, graphene, or a combination thereof.

The particle may have a size of less than or equal to about 1 micrometers (μm).

The organic ligand may be an organic compound having a moiety that binds a surface of the particle and reacts with the alkylammonium compound.

The moiety may be a carboxyl group, a thiol group, an amine group, an amide group, —P═S, —P═Se, a hydroxyl group, or a combination thereof.

The organic ligand may be selected from RCOOH, RSH, $R_3N$, $R_2NCOR$, $R_3P$, $R_3PO$, $R_3PS$, $R_3PSe$, or ROH, wherein each group R is independently hydrogen, a C1 to C24 alkyl group, a C2 to C24 alkenyl group, or a C5 to C24 aryl group.

The organic ligand may be a polymeric compound having a unit that includes a moiety that binds to the surface of the particle.

The obtaining of the particle may include disposing the particle on a substrate.

The particle may be in a powder form and the contacting the particle with an alkyl ammonium salt may be conducted by spraying, adding by drops, or vaporizing the alkyl ammonium salt onto the particle in the powder form.

The heat-treating of the particle may be conducted by heating, light-irradiation, microwave-irradiation, or a combination thereof.

The alkylammonium compound may be a tetraalkyl ammonium hydroxide, a tetraalkyl ammonium halide, a tetraalkyl ammonium borohydride, a tetraalkyl ammonium nitrate, a tetraalkyl ammonium phosphate, a tetraalkyl ammonium sulfate, a tetraalkyl ammonium hydrogen sulfate, or a combination thereof.

The solvent may include water, a C1 to C10 straight or branched alcohol, or a combination thereof.

The solvent may include water, methanol, ethanol, or a combination thereof.

The heat-treating may be carried out at a temperature of greater than or equal to about 80° C.

The heat-treating may be conducted at a temperature of less than or equal to about 400° C.

In another embodiment, a method of producing a device includes:

obtaining a particle having an organic ligand disposed on a surface thereof;

disposing the particle on a substrate;

contacting the particle with an alkylammonium salt represented by

Chemical Formula 1:

 $NR'_4{}^+A^-$     Chemical Formula 1 wherein groups R' are the same or different and are each independently hydrogen or a C1 to C20 alkyl group, provided that at least one group R' is an alkyl group, and A is a hydroxide anion, a halide anion, a borohydride anion, a nitrate anion, a phosphate anion, or a sulfate anion; and heat-treating the particle to initiate and carry out a reaction between the alkylammonium salt and the organic ligand.

The particle may be in a powder form and the contact of the particle with the alkyl ammonium salt may be conducted by spraying, dropwise-addition, or vaporizing the alkyl ammonium salt onto the particle in the powder form.

The contacting the particle with an alkyl ammonium salt may be carried out for a portion of the particles.

The substrate may include silicon, glass, a polymer, a metal oxide, a metal nitride, or a combination thereof.

The substrate may include a pattern of a conductive material formed on a surface thereof.

In still another embodiment, a device produced by the aforementioned method is provided.

The device may be an optoelectronic device.

In still another embodiment, a device may include
a substrate, and
a thin film disposed on the substrate,
wherein the thin film includes a first portion and a second portion and further includes a plurality of particles having a size of less than or equal to about 1 micrometer (μm),
wherein the first portion of the thin film includes a particle including an organic ligand disposed on a surface of the particle and a particle having no such organic ligand.

The particle may include a metal, a semiconductor nanocrystal, a ceramic material, a carbon nanotube, graphene, or a combination thereof.

The first portion of the thin film and the second portion of the thin film have different electrical properties, optical properties, or a combination thereof.

The foregoing method for removing the organic ligand makes it possible to remove a ligand from a particle or a substrate in a dry condition at a lower temperature without causing deformation of the substrate within a short period of time.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
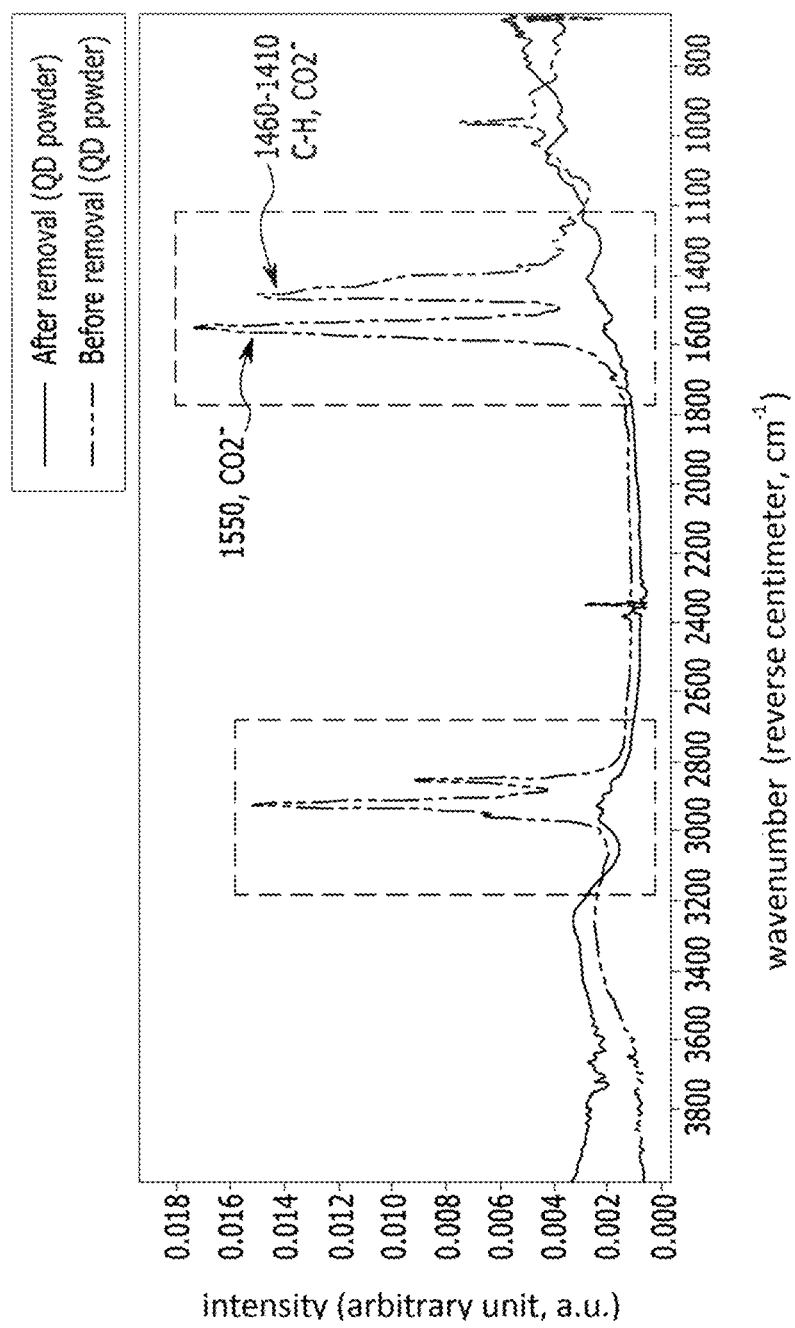
FIG. 1 is a graph of intensity (arbitrary unit) versus wavenumber (reverse centimeter, cm$^{-1}$) showing results of infra-red spectroscopy analysis for the semiconductor nanocrystals prior to and after the removal of the ligand in Example 1.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the invention to those skilled in the art. Thus, in some exemplary embodiments, well-known technologies are not specifically explained to avoid ambiguous understanding of the present inventive concept. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise. Unless specified otherwise, the term "or" means "and/or."

As used herein, the term "particle" refers to an entity having any predetermined or irregular shape. For example, the particle may have a shape of a sphere, an ellipse, a cube, a cuboid, a cylinder, a column, a tube, a helix, a funnel, a sheet, a plate, a wire, a multi-pod or a multi-arm, a tetrahedron, a pyramid, a cuboctahedron, a polygon, a sandglass, but it is not limited thereto.

As used herein, the term "ceramic material" refers to a inorganic, non-metallic material made from a metal or metalloid compound and a non-metallic compound, non-limiting examples of which include an oxide such as alumina, silica, titania, and ceria, a metal carbide, a metal boride, a metal nitride, a metal silicide, and the like.

As used here, the term "alkyl" may refer to a straight or branched chain saturated aliphatic hydrocarbon having the specified number of carbon atoms and having a valence of at least one. Non-limiting examples of "alkyl" include methyl, ethyl, n-propyl, iso-propyl, n-butyl, iso-butyl, sec-butyl, and tert-butyl.

As used herein, the term "alkenyl group" may refer a straight or branched chain hydrocarbon that comprises at least one carbon-carbon double bond and having a valence of at least one, optionally substituted with one or more substituents where indicated, provided that the valence of the alkenyl group is not exceeded. Non-limiting examples of "alkenyl" include vinyl, 1-propenyl, 2-propenyl, 1-butenyl, 2-butenyl, and 3-butenyl.

As used herein, the term "aryl" group may refer to a cyclic group in which all ring members are carbon and at least one ring is aromatic, the group having the specified number of carbon atoms, and having a valence of at least one, optionally substituted with one or more substituents where indicated, provided that the valence of the aryl group is not exceeded. More than one ring may be present, and any additional rings may be independently aromatic, saturated or partially unsaturated, and may be fused, pendant, spirocyclic, or a combination thereof. Non-limiting examples of "aryl" include phenyl, 2-methylphenyl, 3-methylphenyl, 4-methylphenyl, naphthyl, and biphenyl.

In an embodiment, a method for removing an organic ligand from a surface of a particle includes:

obtaining a particle having an organic ligand disposed on a surface thereof;

contacting the particle with an alkylammonium salt represented by Chemical Formula 1:

$$NR'_4{}^+A^-$$  Chemical Formula 1 wherein groups R' are the same or different and are each independently hydrogen or a C1 to C20 alkyl group, provided that at least one group R' is an alkyl group, and $A^-$ is a hydroxide anion, a halide anion, a borohydride anion, a nitrate anion, a phosphate anion, or a sulfate anion; and heat-treating the particle to carry out a reaction between the alkylammonium salt and the organic ligand.

The contacting the particle with the alkylammonium salt may include dissolving the alkylammonium salt in a solvent to prepare a solution and applying the solution to the particle. The heat-treating of the particle may include removing a reaction product of the alkyl ammonium salt and the organic ligand. The method may further include washing the heat-treated particle with a solvent.

The particle may include a metal, a semiconductor nanocrystal, a ceramic material, a carbon nanotube, graphene, or a combination thereof.

Examples of the metal may include, but are not limited to, Pd, Pt, Ni, Co, Rh, Ir, Fe, Ru, Au, Ag, Cu, and a combination thereof.

Examples of the semiconductor nanocrystal may include a Group II-VI compound, a Group III-V compound, a Group IV-VI compound, a Group IV compound, or a combination thereof. The Group II-VI compound may be selected from a binary element compound selected from CdSe, CdTe, ZnS, ZnSe, ZnTe, ZnO, HgS, HgSe, HgTe, MgSe, MgS, and a combination thereof, a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compound semiconductor may be selected from a binary element compound selected from GaN, GaP, GaAs, GaSb, AlN, AlP, AlAs, AlSb, InN, InP, InAs, InSb, and a combination thereof, a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may be selected from a binary element compound selected from SnS, SnSe, SnTe, PbS, PbSe, PbTe, and a combination thereof, a ternary element compound selected from SnSeS, SnSeTe, SnSTe, PbSeS, PbSeTe, PbSTe, SnPbS, SnPbSe, SnPbTe, and a combination thereof, and a quaternary element compound selected from SnPbSSe, SnPbSeTe, SnPbSTe, and a combination thereof. The Group IV compound may be selected from a singular element compound selected from Si, Ge, and a combination thereof, and a binary element compound selected from SiC, SiGe, and a combination thereof.

The binary element compound, the ternary element compound, or the quaternary element compound may be present in a uniform concentration in a particle, or may be present in a locally different concentration in a single particle. The semiconductor nanocrystal may have a core-shell structure wherein a semiconductor nanocrystal surrounds another (different) semiconductor nanocrystal. The core and shell may have an interface, and an element in of at least one of the core or the shell in the interface may have a concentration gradient wherein the concentration of the element(s) of the shell decreases toward the core. The semiconductor nanocrystal may have one core of a semiconductor nanocrystal and multi-shells surrounding the core. The core and multi-shell structure has at least two shells wherein each shell may be a single composition, an alloy, or the one having a concentration gradient.

According to non-limiting examples, in the semiconductor nanocrystal particle, the materials of the shell may have a larger energy bandgap than that of the core, and thereby the semiconductor nanocrystal may exhibit a quantum confinement effect more effectively. In case of a multi-shell type of semiconductor nanocrystal particle, the bandgap of the material of an outer shell may be higher energy than that of the material of an inner shell (a shell that is closer to the core). In this case, the semiconductor nanocrystal may emit light of a wavelength ranging from UV to infrared light.

The semiconductor nanocrystal may have quantum efficiency of greater than or equal to about 50%, or greater than or equal to about 70%, or greater than or equal to about 90%. Within such ranges, it becomes possible to enhance the luminescence efficiency of the device.

The semiconductor nanocrystal may be designed to have a wider or narrower full width at half maximum (FWHM) in its photoluminescence spectrum depending on its application. By way of an example, for use in display devices, the semiconductor nanocrystal may have a narrower FWHM so as to realize enhanced color purity or color reproducibility. The semiconductor nanocrystal may have a FWHM of less than or equal to about 45 nanometers (nm), for example less than or equal to about 40 nm, or less than or equal to about 30 nm. Within such ranges, a device including the nanocrystal may have enhanced color purity or improved color reproducibility.

Examples of the ceramic material may include a metal (or metalloid) oxide such as silica and titanium oxide, and a metal nitride such as aluminum nitride, but it is not limited thereto. As stated above, when the particle includes at least two compounds, it may have a core-shell structure, an alloy structure, or the like. The particle may have a size of less than or equal to about 1 micrometer (μm). In an embodiment, the particle may have a size of less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm. As defined above, the particle may have a shape of a sphere, an ellipse, a cube, a cuboid, a cylinder, a column, a tube, a helix, a funnel, a sheet, a plate, a wire, a multi-pod or a multi-arm, a tetrahedron, a pyramid, a cuboctahedron, a polygon, a sandglass, or any of various common regular and irregular shapes, and for example, the particle may be a nanoparticle, a nanowire, a nanofiber, a nanosheet, and the like. Alternatively, the particle may have an irregular shape.

The particle includes an organic ligand disposed on (e.g., surrounding) a surface thereof. The organic ligand may be one that has been added to a reaction system during the synthesis process of the particle, for example, in order to control the size and the shape of the particle or in order to prevent aggregation of the particles. In some embodiments, the organic ligand may be introduced so as to impart a desired property to a surface of the particle or to improve miscibility with a surrounding medium of the particle.

The surface organic ligand as mentioned above may be required to be removed for different reasons. For example, if the particles are to be applied to an electronic device, the organic ligand may be one of the factors causing deterioration of the properties of the device. In some cases, the organic ligand may be required to be removed for the purpose of enhancing the performance of the device (e.g., improving conductivity or illumination properties thereof). When the particle is a constituent of a catalyst, the organic ligand on the surface thereof may be required to be removed for the purpose of increasing the catalytic ability of the catalyst. In some other cases, the organic ligand may be separated from the particle for the purpose of characterizing the particle or the ligand itself.

The organic ligand may be an organic compound having a moiety (a functional group) capable of binding to a surface of the particle and reacting with the alkylammonium compound (hereinafter also referred to as "a reactive moiety"). As used herein, the term "binding" refers to "linking to a particle surface via a physical or a chemical interaction (e.g., hydrogen bonding, coordination bonding, covalent bonding, or the like). For example, the reactive moiety may be a carboxyl group (—COOH), a thiol group (—SH), an amine group (—NR$_2$, wherein R is hydrogen or a C1 to C10 alkyl group), an amide group (—NRC=O—, wherein R is hydrogen or a C1 to C10 alkyl group), a nitrile group (—CN), R$_3$P (wherein R is hydrogen or a C1 to C10 alkyl group), R$_3$PO (wherein R is hydrogen or a C1 to C10 alkyl group), —P=S, —P=Se, a hydroxyl group, or a combination thereof. In an embodiment, the organic ligand may be selected from RCOOH, RSH, R$_3$N, R$_2$NCOR, R$_3$P, R$_3$PO, R$_3$PS, R$_3$PSe, or ROH, wherein groups R are each independently hydrogen, a C1 to C24 alkyl group, a C2 to C24 alkenyl group, or a C5 to C24 aryl group.

The organic ligand may be a polymeric compound having a unit that includes a moiety capable of binding the surface of the particle.

Examples of the organic ligand may include a C1 to C40 carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and palmitic acid, and stearic acid; a C1 to C40 thiol compound such as methane thiol, ethane thiol, propane thiol, butane thiol, pentane thiol, hexane thiol, octane thiol, dodecane thiol, hexadecane thiol, octadecane thiol, and benzyl thiol; a C1 to C40 alcohol compound such as methanol, ethanol, propanol, and butanol; a C1 to C40 amine compound such as methane amine, ethane amine, propane amine, butane amine, pentane amine, hexane amine, octane amine, dodecane amine, hexadecane amine, octadecane amine, and benzyl amine; a C1 to C40 amide compound such as methyl amide, ethyl amide, propyl amide, butyl amide, pentyl amide, hexyl amide, octyl amide, dodecyl amide, hexadecyl amide, octadecyl amide, and benzyl amide; a C1 to C40 ester compound such as methyl acetate, ethyl acetate, methyl propionate, ethyl propionate; a C1 to C40 phosphine compound such as triphenyl phosphine; phosphine oxides such as trioctyl phosphine oxide; phosphine sulfides such as trioctyl phosphine sulfides; and phosphine selenides such as trioctyl phosphine selenides, but it is not limited thereto. The organic ligand may be used alone or as a mixture of at least two compounds.

The obtaining of the particle may further include disposing the particle on a substrate. Material types of the substrate are not particularly limited, and may be selected appropriately as long as they are not damaged by the organic ligand or the alkylammonium compound as described below. The substrate may be silicon, glass, a polymer such as polyethylene, polypropylene, polyester, polycarbonate, and polyimide, a metal oxide, a metal nitride, or an organic-inorganic hybrid material. The substrate may have any shape. The substrate may be a part of an electronic device. The substrate may be a support for a catalyst. The method of disposing the particle on the substrate is not particularly limited, and may be selected in light of types of the particle having the ligand on a surface thereof, the material type of the substrate, and the like. For example, the particle may be disposed by simple addition by drops, various coating methods (e.g., a spin coating), or the like, but it is not limited thereto.

The particle having the ligand on a surface thereof may contact an alkyl ammonium salt represented by Chemical Formula 1:

NR′$_4^+$A$^-$  Chemical Formula 1 wherein R′ and A$^-$ are the same as defined above.

The alkylammonium salt may be a tetraalkyl ammonium hydroxide, a tetraalkyl ammonium halide, a tetraalkyl ammonium borohydride, a tetraalkyl ammonium nitrate, a tetraalkyl ammonium phosphate, a tetraalkyl ammonium sulfate, a tetraalkyl ammonium hydrogen sulfate, or a combination thereof.

The contacting of the particle with the alkylammonium salt may include dissolving the alkylammonium salt in a solvent to prepare a solution, and contacting the solution with the particle (e.g., by applying the solution to the particle). The solvent is not particularly limited, but may be any one as long as it may dissolve the alkyl ammonium salt compound and does not have any substantial effect on the reaction between the ligand and the alkylammonium salt compound. In an embodiment, the solvent may include water, a C1 to C10 straight or branched alcohol such as methanol, ethanol, and propanol, or a combination thereof.

The concentration of the alkylammonium salt compound in the solution is not particularly limited, and may be selected appropriately in light of the types of the alkylammonium salt compound, the types of the solvent, the types of the ligand to be removed, the types of the substrate, the types of the particle, and the like.

The contacting may be carried out in any manner. In an embodiment, the particle may be in the form of a powder. In an embodiment, the contacting may be carried out by spraying or addition by drops of the solution to the particle. In an embodiment, the particle is in the powder form, and the solution is vaporized and comes into contact with the particle. When the particle is disposed on the substrate, the contacting may be conducted selectively (i.e., only at a selected area) such that the ligand may be selectively removed, allowing the patterning of the surface of the substrate. When the ligand is removed, the particle may show conductivity and photoluminescence extinction time that are different from those of the particle prior to the removal of the ligand. Therefore, the aforementioned method for removing the ligand may be advantageously applied to produce an electronic device capable of using such differences.

On the other hand, the contacting the particle with an alkylammonium salt in a solution may include the contacting the particle with a solvate of the alkylammonium salt or the contacting the particle with a solvate of the alkylammonium cation. As used herein, the term "solvate" may refer to a complex between a solvent and a dissolved species. Accordingly, the term "a solvate of the alkylammonium salt" may refer to a complex between the alkylammonium salt and the molecules of the solvent, and the term "a solvate of the alkylammonium cation" may refer to a complex between the alkylammonium cation and the molecules of the solvent.

When the particle being in contact with the alkylammonium salt compound is heat-treated, a reaction between the alkylammonium compound and the organic ligand may be initiated (triggered) and carried out. When the alkylammonium compound is used as a solution, the reaction may be triggered after the solvent being used to prepare the solution is removed by drying. The reaction allows the organic ligand to be detached and removed from the particle. The reaction may convert the organic ligand to a volatile compound, which may then be easily removed by volatilization.

The temperature of the heat-treating is not particularly limited as long as it may trigger the reaction between the alkylammonium salt and the organic ligand. The temperature of the heat-treating may be selected appropriately in light of the ligand type, the type of the alkylammonium salt, and the substrate material. In an embodiment, the heat-treating may be carried out at a temperature of greater than or equal to a boiling point of the solvent. Therefore, the reaction may occur even in the absence of the solvent. In an embodiment, the heat-treating may be carried out even at a temperature of greater than or equal to about 80° C., for example, greater than or equal to about 90° C., greater than or equal to about 100° C., greater than or equal to about 120° C., greater than or equal to about 130° C., greater than or equal to about 150° C., greater than or equal to about 160° C., greater than or equal to about 170° C., or greater than or equal to about 180° C. In an embodiment, the heat-treating may be carried out at a temperature of less than or equal to about 400° C. The manners of the heat-treating are not particularly limited and may be selected appropriately. For example, the heat-treating is carried out by heating, irradiation of a light source such as UV light, or irradiation of microwaves or a combination thereof. Time for the heat-treating is not particularly limited, but may be selected as desired. The atmosphere of the heat-treating is not particularly limited, so the heat-treating may be carried out in air, under an atmosphere of an inert gas, or under vacuum, if desired.

Without wishing to be bound by any theory, the alkyl group of the alkylammonium salt and the reactive moiety of the ligand react with each other so that the ligand may be detached from the particle and converted into an easily removable (e.g., volatile) compound. For example, when the organic ligand is an alkyl carboxylic acid compound or an alkyl thiol compound, it may be converted into an alkyl carboxylic acid ester or alkyl thioester via reaction with the alkylammonium compound. The acid ester or the thioester is a volatile compound and thus may be easily removed due to its volatility, for example by evaporation. After the reaction with the organic ligand, the alkylammonium salt is converted into an amine, which may be removed with ease.

If desired, the particle may be subjected to a washing process with a solvent suitable for removal of the remaining alkylammonium compound. The solvent for the washing process may be the same as or different from the solvent being used for the production of the alkylammonium salt solution.

After the ligand is removed from the surface of the particle by simple heating, the particle (e.g., the core metal or the semiconductor nanocrystal) may be capable of deforming. Even when the deformation does not occur, removing the ligand simply by heating may require a complex heat-treating process or heating the particle for a long time. In contrast, the aforementioned method for removing the organic ligand makes it possible to remove the ligand easily without substantial deformation of the core material.

In order to remove the ligand from the surface of the particle disposed on a substrate which is a part of an electronic device, the electronic device is required to be heated, for example at a high temperature for extended hours, or to be immersed in a solvent capable of removing the ligand. Under such conditions, the electronic device may be easily damaged. In contrast, in accordance with the ligand removal method of the foregoing embodiments, the process of removing the ligand may be carried out in a gaseous environment (for example, in the atmosphere of air or any other gas, or under vacuum) and at a relatively low temperature, making it possible to avoid deterioration or damage of the device. In addition, as mentioned above, the ligand may be removed in a selective manner, and thus a pattern of particles exhibiting different properties may be obtained.

The ligand detached from the particle via the reaction with the alkylammonium salt may be converted into a more volatile compound, and its original reactive moiety (e.g., a carboxyl group or a thiol group) may become an inactive group (e.g., an ester). Therefore, such a ligand is less likely to remain on or to react again with the surface of the particle or the substrate. In particular, the detachment and the removal of the ligand may be accomplished within a significantly shortened period of time in comparison with the simple heating.

The foregoing method for removing a ligand may find great utility in various fields wherein the ligand present on the surface of the particle should be removed without any substantial deformation of the particle or the substrate. For example, when nano- or micro-sized particles are disposed on a surface of a device, the ligand surrounding a surface of the particle may be easily removed to enhance some properties (e.g., conductivity) of the particle or the device. In a nano- or micro-sized catalyst particle being supported on a substrate or a support, it becomes possible to remove the surface ligand and enhance catalytic activity. In addition, as the method enables the ligand present on a surface of a particle to be removed without deformation of the particle within a shortened period of time, it may be advantageously utilized as a pre-treatment process for analyzing the particle or the ligand.

In other embodiments, a method of producing a device includes:

obtaining a particle having an organic ligand disposed on a surface thereof;

disposing the particle on a substrate;

contacting the particle with an alkylammonium salt compound represented by Chemical Formula 1:

$NR'_4{}^+A^-$  Chemical Formula 1 wherein groups R' are the same or different and are each independently hydrogen or an alkyl group of C1 to C20 provided that at least one group R' is an alkyl group, and A is a hydroxide anion, a halide anion, a borohydride anion, a nitrate anion, a phosphate anion, or a sulfate anion; and heat-treating the particle to carry out a reaction between the alkylammonium salt and the organic ligand.

Details related to the substrate, the particle, the organic ligand, and the alkylammonium salt compound are the same as set forth above, and therefore, will not be discussed here. In addition to what has been explained above, the removal of the organic ligand from the particle surface may be applied to the method of producing the device. For example, the particle may be in the form of a powder, and the contacting the particle with the alkyl ammonium salt may be carried out by spraying, adding by drops, or vaporizing the alkylammonium salt (solution) onto the particle. The substrate may include a pattern of a conductive material (e.g., Al, Ag, Au, or the like) formed on a surface thereof. As stated above, when the ligand is removed from the surface of the particle disposed on the surface of the device, the properties (e.g., conductivity or luminescence properties) may be significantly improved. In addition, as the organic ligand may be selectively removed in a predetermined area from the disposed nanoparticles, it becomes possible to manufacture a device that uses a pattern of particles having different electrical or optical properties. For example, the contacting the particle with the alkylammonium salt may include selectively contacting a part of the particles with the alkylammonium salt. That is, the alkylammonium salt reagent is selectively applied to some portions of the particles disposed onto the substrate via spraying or adding by drops and the other portions of the particles disposed onto the substrate remain intact and the substrate is subjected to a heat-treating. In this case, the portions of the particles having the ligand removed therefrom and the portions of the particle having the ligand remained have different light-emitting properties, which allows the patterning.

Figure 14:
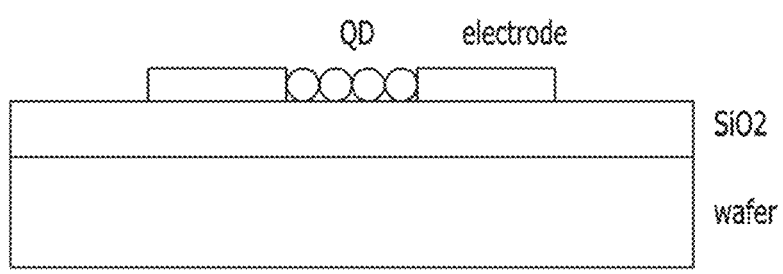
FIG. 14 shows a front view and a side cross-sectional view of a device according to an embodiment.
Figure 14:
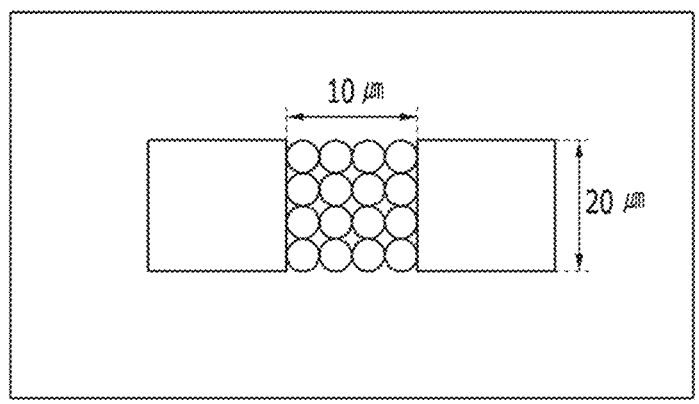

In still other embodiments, a device produced by the aforementioned method is provided. The device may be an optoelectronic device. In a non-limiting example, the device may include a structure illustrated in FIG. 14.

In an embodiment, a device may include
a substrate, and
a thin film disposed on the substrate, wherein the thin film includes a first portion and a second portion and further includes a plurality of particles having a size of less than or equal to about 1 μm, wherein the first portion of the thin film includes a particle including an organic ligand disposed on the surface of the particle and a particle having no such organic ligand.

The particle may include a metal, a semiconductor nanocrystal, a ceramic material, a carbon nanotube, graphene, or a combination thereof.

The first portion of the thin film and the second portion of the thin film have different electrical properties or optical properties.

Hereinafter, the present inventive is illustrated in more detail with reference to specific examples. However, they are exemplary embodiments, and the present disclosure is not limited thereto.

EXAMPLES

Reference Example

Production of CdSe (Core)/CdS (a First Shell)/ZnS (a Second Shell) Nanoparticle 0.5 g of CdSe/CdS/ZnS NCs is prepared as follows. 1.6 mmol of CdO powder (0.206 g, Aldrich, +99.99%) and 6.4 mmol of oleic acid (OA, 1.8 g, Aldrich, 95%) are mixed in 40 mL of trioctylamine (TOA, Aldrich, 95%). The mixed solution is degassed and heated to 150° C. while being stirred rapidly, and then the temperature is further increased to 300° C. under a $N_2$ flow. At 300° C., 0.2 mL of 2.0 M Se (Alfa) in trioctylphosphine (TOP, Strem, 97%) is quickly injected into the Cd-containing reaction mixture. After 90 seconds, 1.2 mmol of n-octanethiol in TOA (210 mL in 6 mL) is injected at the rate of 1 mL/min using a syringe pump, and the reaction proceeds for 40 minutes. A 0.25 M Zn precursor solution is prepared by dissolving 0.92 g of zinc acetate and 2.8 g of OA in 20 mL of TOA at 200° C. under a $N_2$ atmosphere. 16 mL of the Zn-OA solution (about 100° C.) is injected into the Cd-containing reaction medium at the rate of 2 mL/min, and then 6.4 mmol of n-octanethiol in TOA (1.12 mL in 6 mL) is injected at the rate of 1 mL/min using a syringe pump. The total reaction time is 2 hours. After the reaction, the product is cooled to ca. 50 to 60° C., and organic sludge is removed by first centrifugal separation (5,600 rpm). Ethanol (Fisher, HPLC grade) is added to the product solution until an opaque flocculant appears, and nanocrystals thus prepared are separated by centrifugation. The precipitates are dispersed in toluene (Sigma-Aldrich, anhydrous, 99.8%). The nanocrystals thus prepared having octanethiol and oleic acid surrounding a surface thereof.

Example 1

Removing Ligand from the Surface of the Nanocrystal Particles in a Powder Form

An alcohol solution of tetramethyl ammonium hydroxide (conc.: 25 wt %, manufactured by Sigma-Aldrich Co., Ltd.) is obtained. The nanocrystals dispersed in toluene (prepared in Reference Example 1) are precipitated in methanol and separated by centrifugation, which is then dried to prepare nanocrystals in a powder form. The alcohol solution of tetramethyl ammonium hydroxide is applied onto the nanocrystals by adding the solution by drops thereto. The nanocrystals having the solution applied thereto are heated to 200° C. in air or in an inert gas atmosphere.

An FT-IR analysis is made for the nanocrystals as prepared in Reference Example 1 (prior to the foregoing treatment) and the nanocrystals as treated in the foregoing manners using Varian 670-IR, and the results are shown in FIG. 1. The results of FIG. 1 confirm that the treated nanoparticles have no peaks for the ligand compound, which were observed in the spectrum of the nanoparticles prior to the foregoing treatment.

Figure 2:
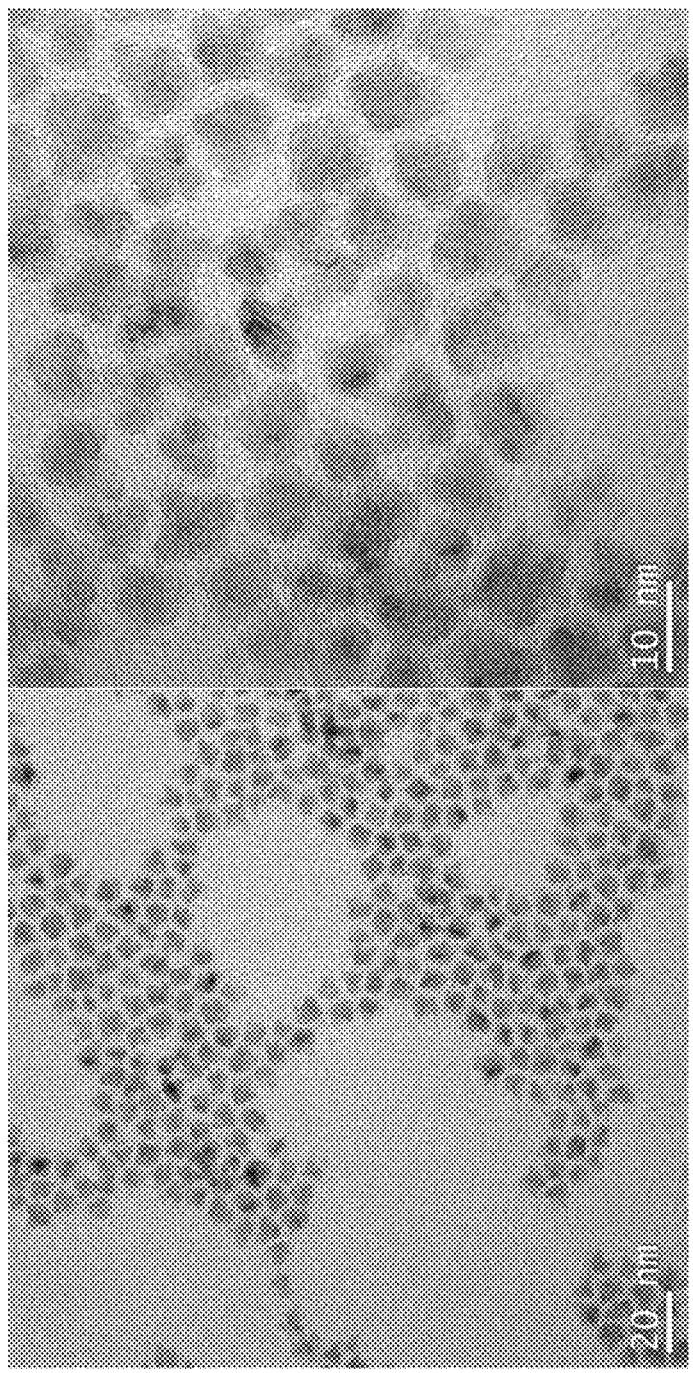
FIG. 2 and FIG. 3 show scanning electron microscopic images of the semiconductor nanocrystals prior to and after the removal of the ligand in Example 1, respectively.
Figure 3:
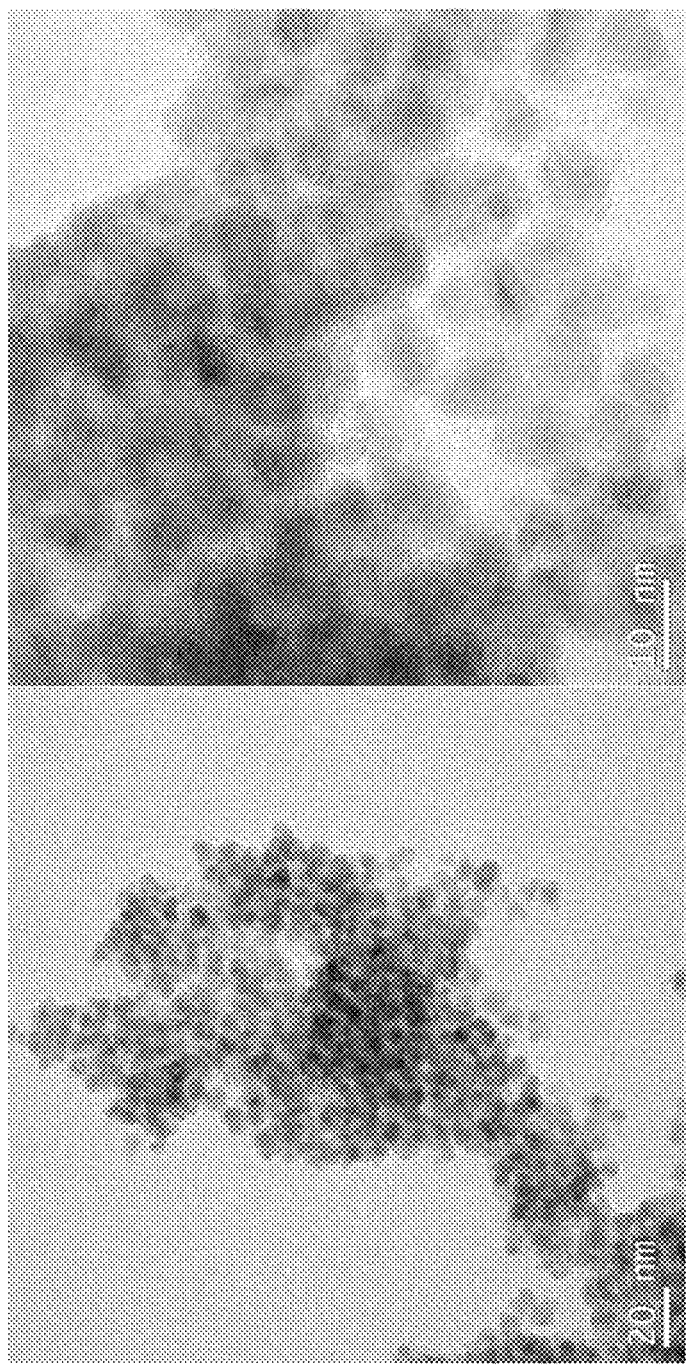

The nanoparticles prior to and after the treatment are subjected to transmission electron microscopic analysis using a TEM instrument (FEI/TECNAI F20 G2 200 kV), and the results are shown in FIG. 2 and FIG. 3. The nanoparticles after being treated show neither particle fusion nor a change in particle size and crystal structure when being compared with the particles prior to the treatment. However, the distance between the untreated particles due to the presence of the organic ligand disappears in the treated particles.

Figure 11:
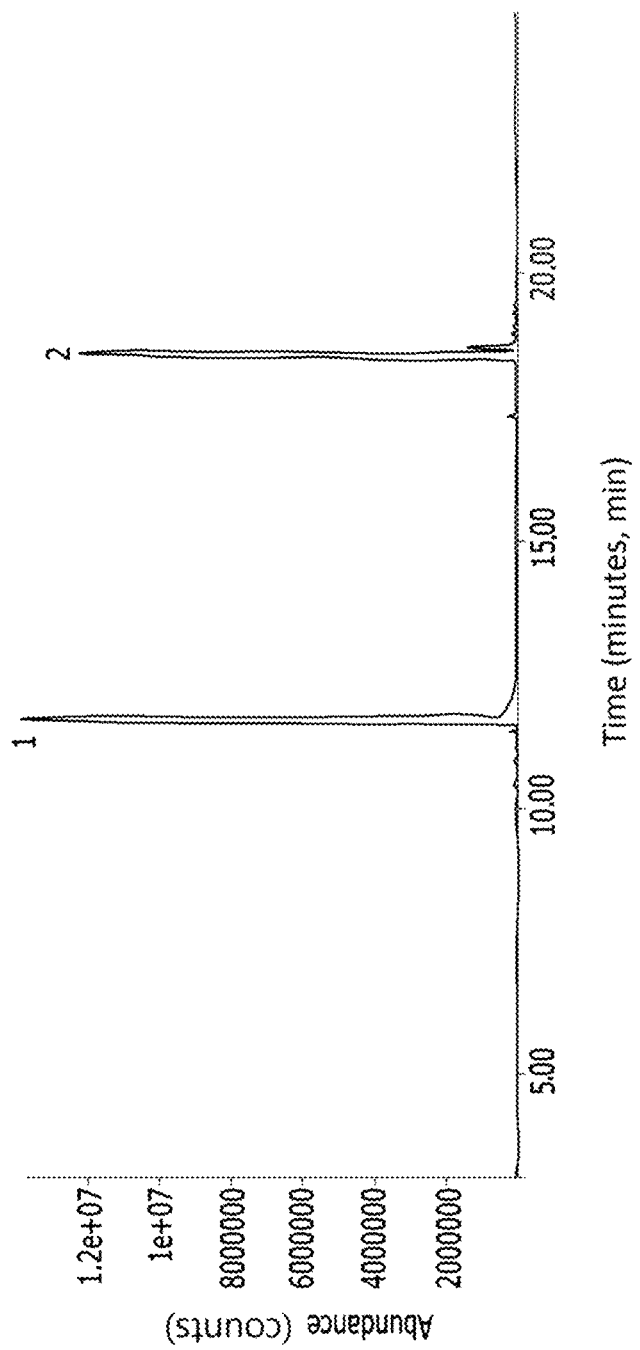
FIG. 11 is a graph of abundance (count) versus retention time (minutes, min) showing the results of gas chromatography analysis conducted in Example 1.
Figure 12:
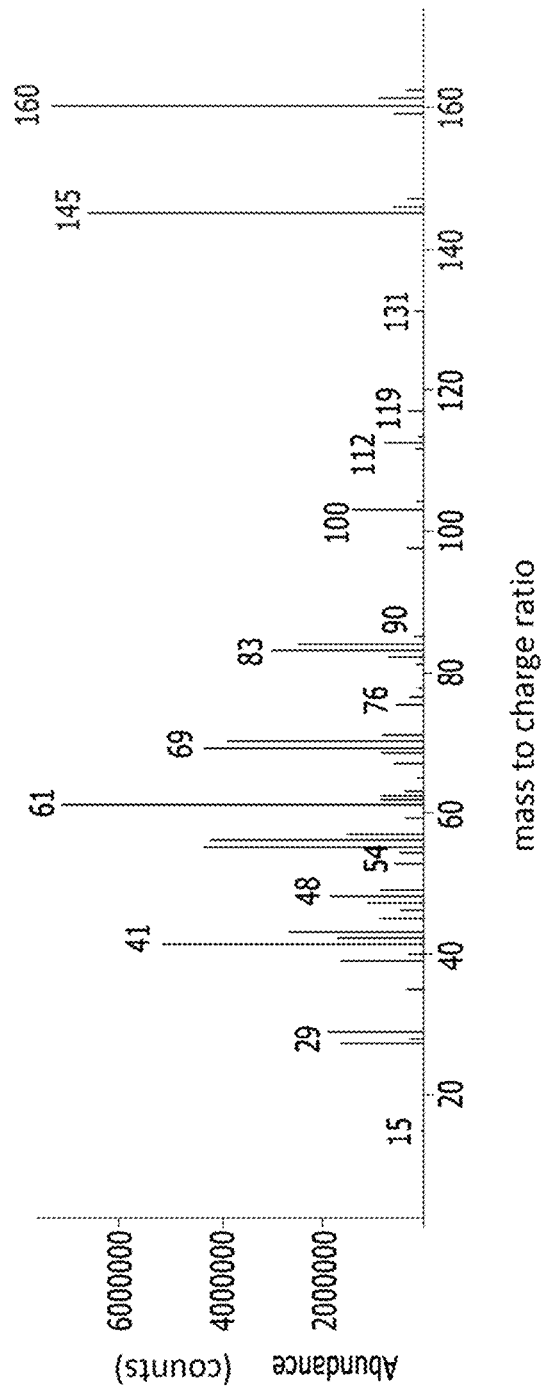
FIG. 12 is a graph of abundance (count) versus mass to charge ratio showing the results of the mass spectroscopy analysis of a collected gas conducted in Example 1.
Figure 13:
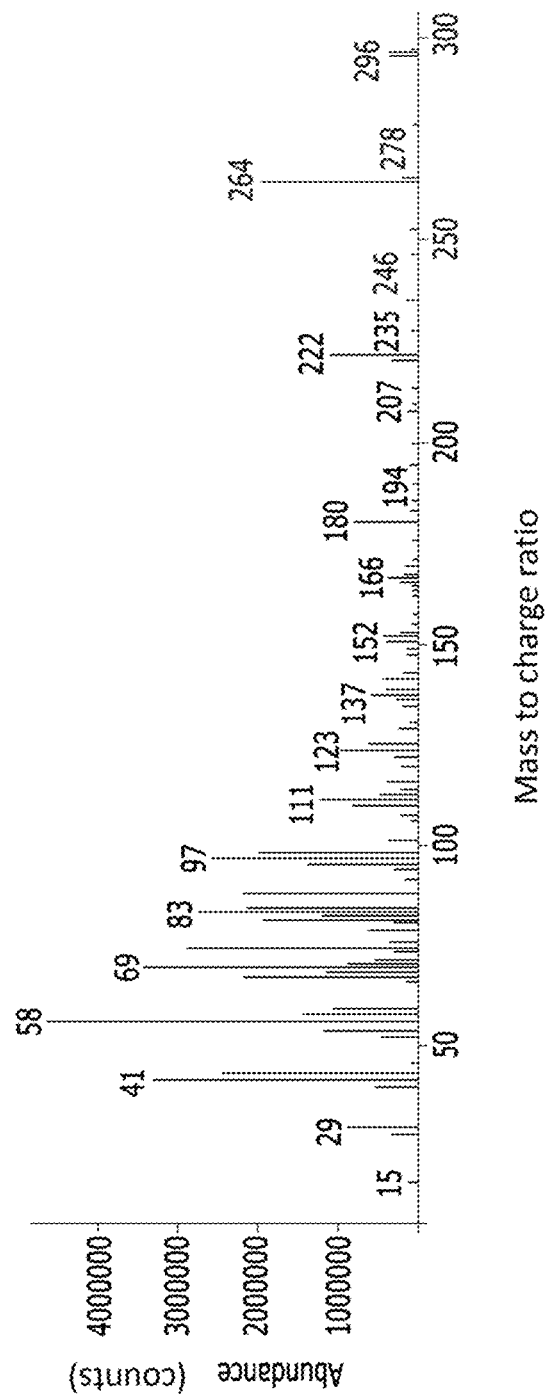
FIG. 13 is a graph of abundance (count) versus mass to charge ratio showing the results of the mass spectroscopy analysis of a collected gas in Example 1.

A gas being emitted when the nanoparticles are heated is collected, and a gas chromatography (GC) analysis and a mass spectroscopy (MS) analysis are made for the collected gas. The results are shown in FIG. 11 (gas chromatogram) and FIG. 12 and FIG. 13 (mass spectrums). From the results, it is confirmed that the collected gas includes a methyl octane thiolate and methyl oleate.

Example 2

The organic ligand is removed by the same treatment method as Example 1, except that the CdSe/CdS/ZnS nanoparticles of Reference Example 1 are disposed on a Si wafer by spin coating to form a film including the CdSe/CdS/ZnS nanoparticles with a thickness of 60 nm.

Photoluminescence (PL) spectrums for the films prior to and after the ligand removal treatment are obtained using a UV-vis spectrometer (Varian Cary 5000) and a fluorometer (Fluorolog JOBIN YVON Horiba). From the results, it is confirmed that substantially no changes are made in the PL spectrums for the films prior to and after the ligand removal treatment. These results imply that the ligand removal treatment bring about no substantial changes in the crystal structure and quantum confinement effect of the CdSe/CdS/ZnS nanocrystal (i.e., the ligand may be removed without changing the characteristics of the nanoparticles).

Example 3

Removing the Ligand Surrounding Gold Nanoparticles from the Surface of the Monolayer Film Thereof An alcohol solution of tetramethyl ammonium hydroxide (conc.: 25 wt %, manufactured by Sigma-Aldrich Co., Ltd.) is obtained.

Gold nanoparticles having dodecanethiol surrounding a surface thereof (manufactured from Ocean nanotech Co., Ltd.) are dispersed in chloroform, and a Cu grid is immersed in the resulting dispersion to form a monolayer of gold nanoparticles on the Cu grid. The alcohol solution of tetramethyl ammonium hydroxide is applied onto the nanoparticles by adding the solution by drops thereto. The nanoparticles having the solution applied thereto are heated to 150° C. in air or in an inert gas atmosphere.

Figure 5:
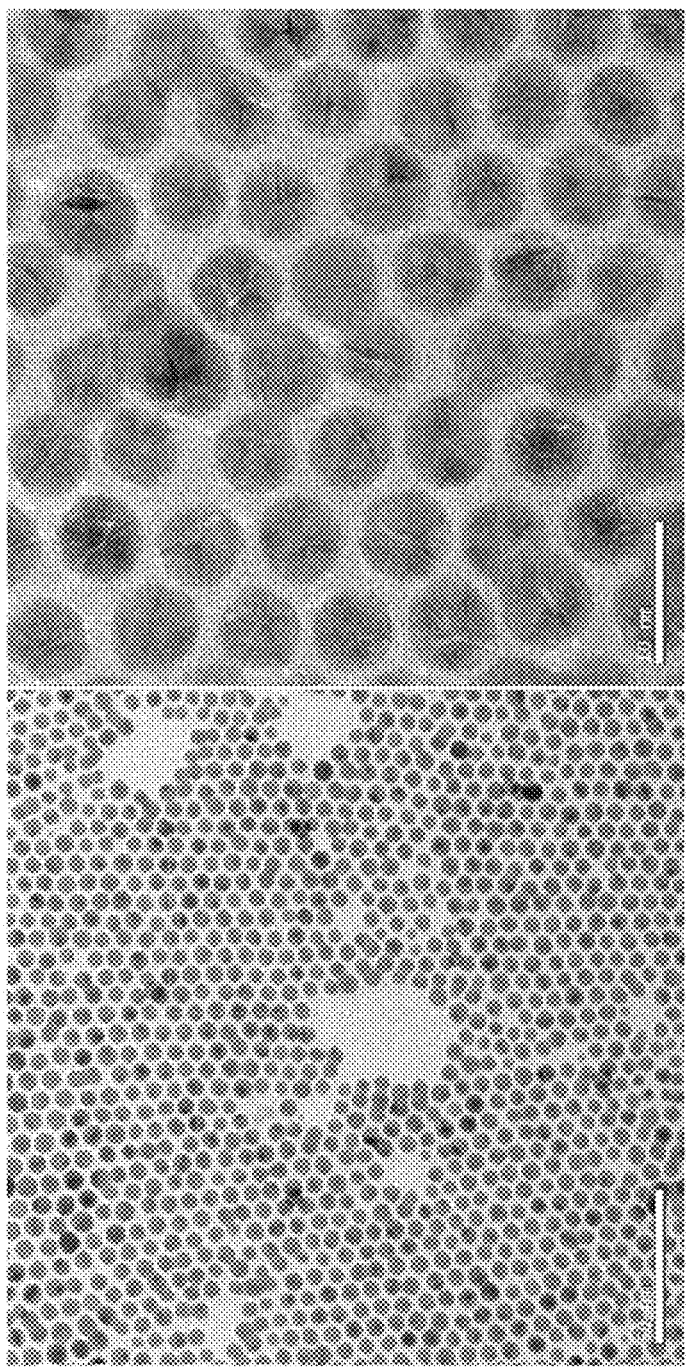
FIG. 5 and FIG. 6 show transmission electron microscopic images of the metal nanocrystals prior to and after the removal of the ligand in Example 3, respectively.
Figure 6:
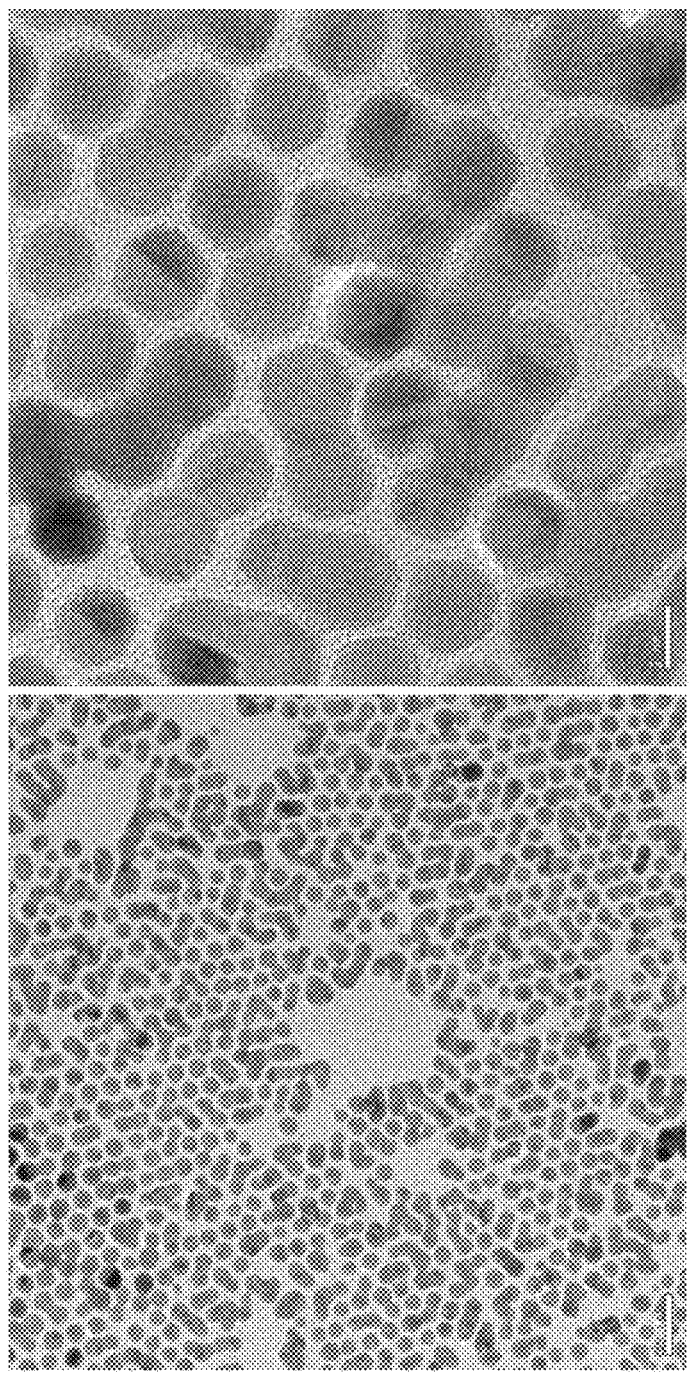

The nanoparticles prior to and after the treatment are subjected to transmission electron microscopic analysis using a TEM instrument (FEI/TECNAI F20 G2 200 kV), and the results are shown in FIG. 5 and FIG. 6. The results of FIG. 5 and FIG. 6 confirm that the ligand may be removed without causing any changes in the shape of the gold nanoparticles, and the removal of the ligand does not cause any substantial aggregation of the particles.

Example 4

Removing the Ligand Surrounding Gold Nanoparticles from the Surface of the Monolayer Film Thereof An alcohol solution of tetramethyl ammonium hydroxide (conc.: 25 wt %, manufactured by Sigma-Aldrich Co., Ltd.) is obtained. Gold nanoparticles having dodecanethiol surrounding a surface thereof (manufactured by Ocean Nano-Tech Co., Ltd.) are dispersed in chloroform, and a Cu grid is immersed in the resulting dispersion to form a monolayer of gold nanoparticles on the Cu grid. The alcohol solution of tetramethyl ammonium hydroxide is applied onto the nanoparticles by adding the solution by drops thereto. The nanoparticles having the solution applied thereto are heated to 100° C. and 140° C., respectively, in air or in an inert gas atmosphere.

Figure 7:
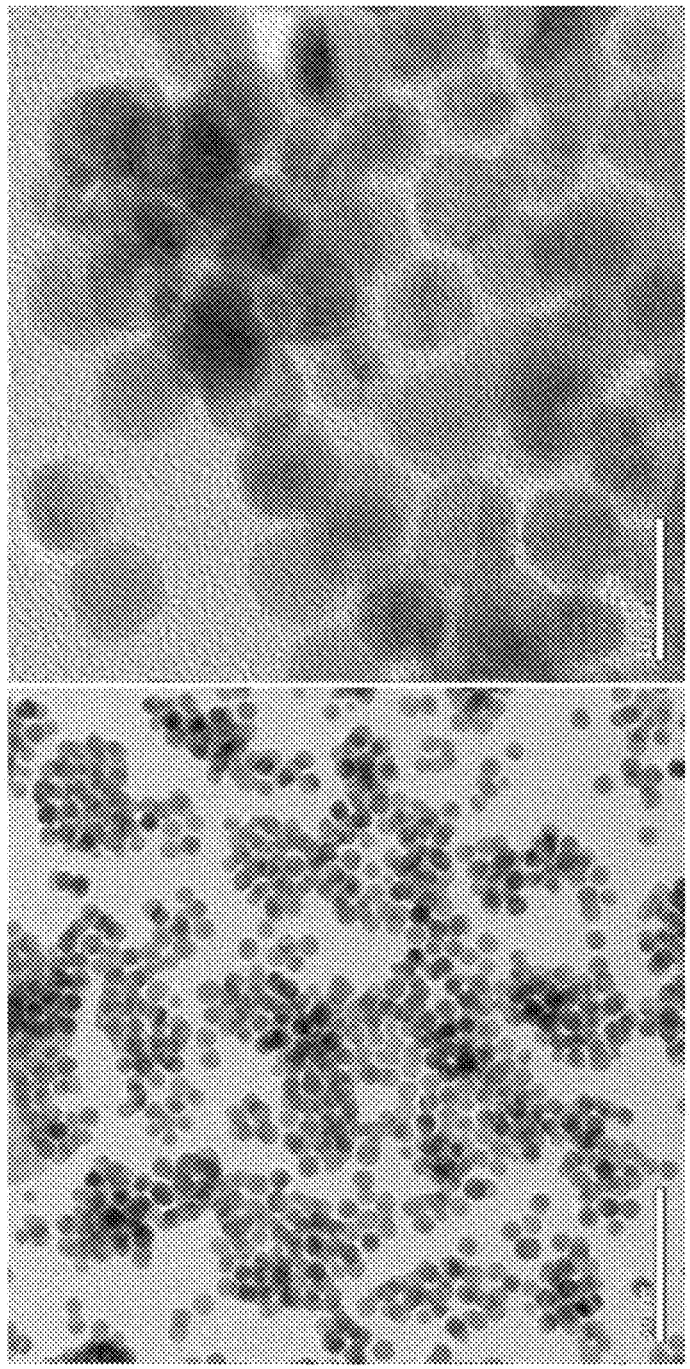
FIG. 7 and FIG. 8 show transmission electron microscopic images of the metal nanocrystals after the removal of the ligand by the heat-treating at a temperature of 100° C. and 140° C. in Example 4, respectively.
Figure 8:
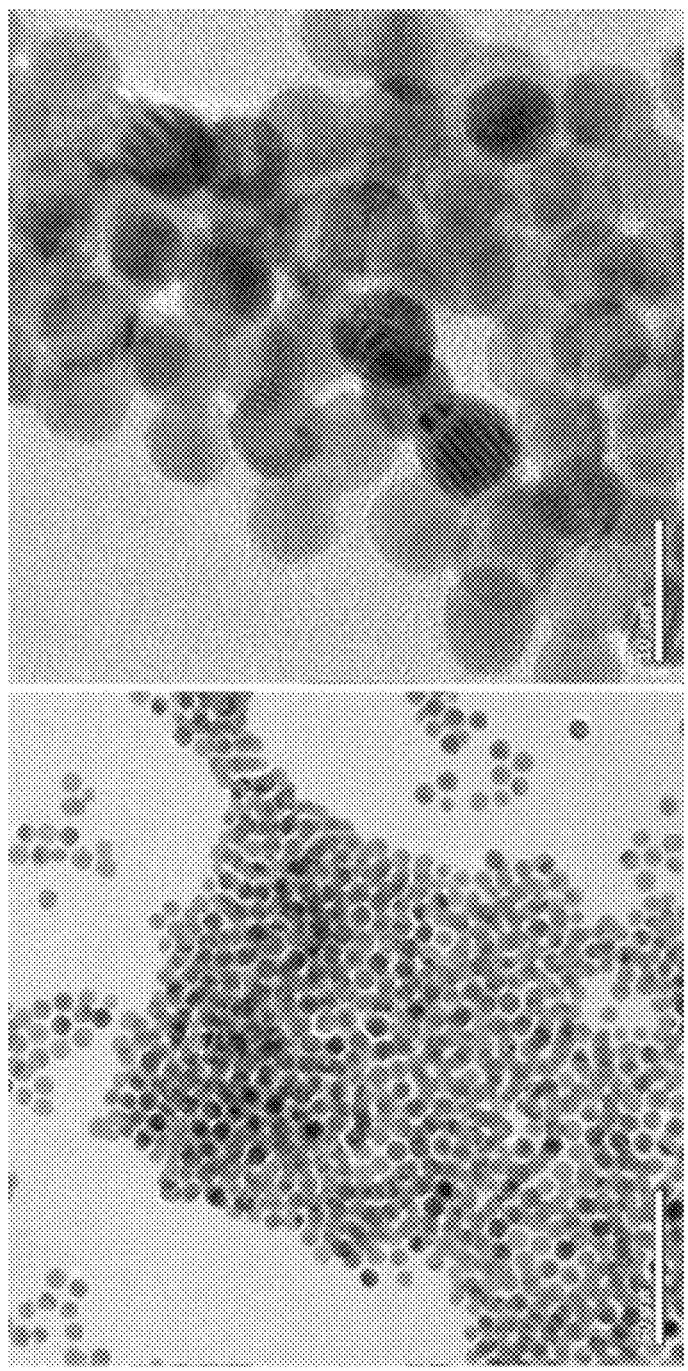

The nanoparticles prior to and after the treatment are subjected to transmission electron microscopic analysis using a TEM instrument (FEI/TECNAI F20 G2 200 kV), and the results are shown in FIG. 7 and FIG. 8. The results of FIG. 7 and FIG. 8 confirm that after the removal of the ligand, the distance between the gold nanoparticles is changed (because the ligand is removed), and that the size of each particle does not substantially change.

Example 5

Production of Optoelectronic Device and Measurement of Photocurrent and Dark Current A substrate having an aluminum electrode pattern formed on a Si wafer is obtained. The nanocrystal dispersion prepared in Reference Example 1 is spin-coated on the substrate to produce a device shown in FIG. 14. The device includes a thin film consisting of CdSe nanoparticles. The surface of the thin film of the nanoparticles of the device thus prepared is treated in the same manner as set forth in Example 1. That is, the alcohol solution of the tetramethyl ammonium hydroxide is applied by drops to the surface of the thin film of the nanoparticles. The device having the solution applied to the surface thereof is heated at a temperature of 200° C. in air or under an inert gas atmosphere.

Figure 4:
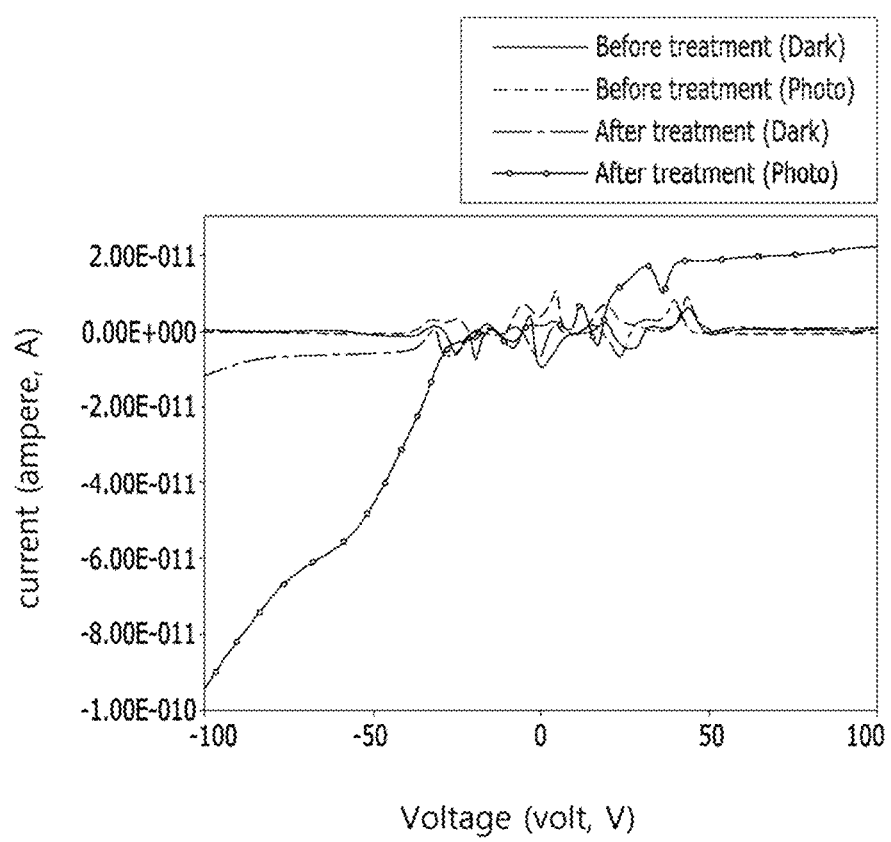
FIG. 4 is a graph of current (ampere, A) versus voltage (volt, V) showing results of a current-voltage experiment as measured by irradiating light to the semiconductor nanocrystals prior to and after the removal of the ligand in Example 2.

For the device as produced, an experiment for measuring dark current and photocurrent is made prior to and after the treatment and the results are shown in FIG. 4. The results of FIG. 4 confirm that the CdSe based nanocrystals show increases in the dark current and photocurrent after the organic ligand is removed therefrom, and particularly, the photocurrent significantly increases.

Comparative Example

A gold nanoparticle film is prepared in the same manner as set forth in Example 4, except that the alcohol solution of tetramethyl ammonium hydroxide is applied thereto.

Figure 9:
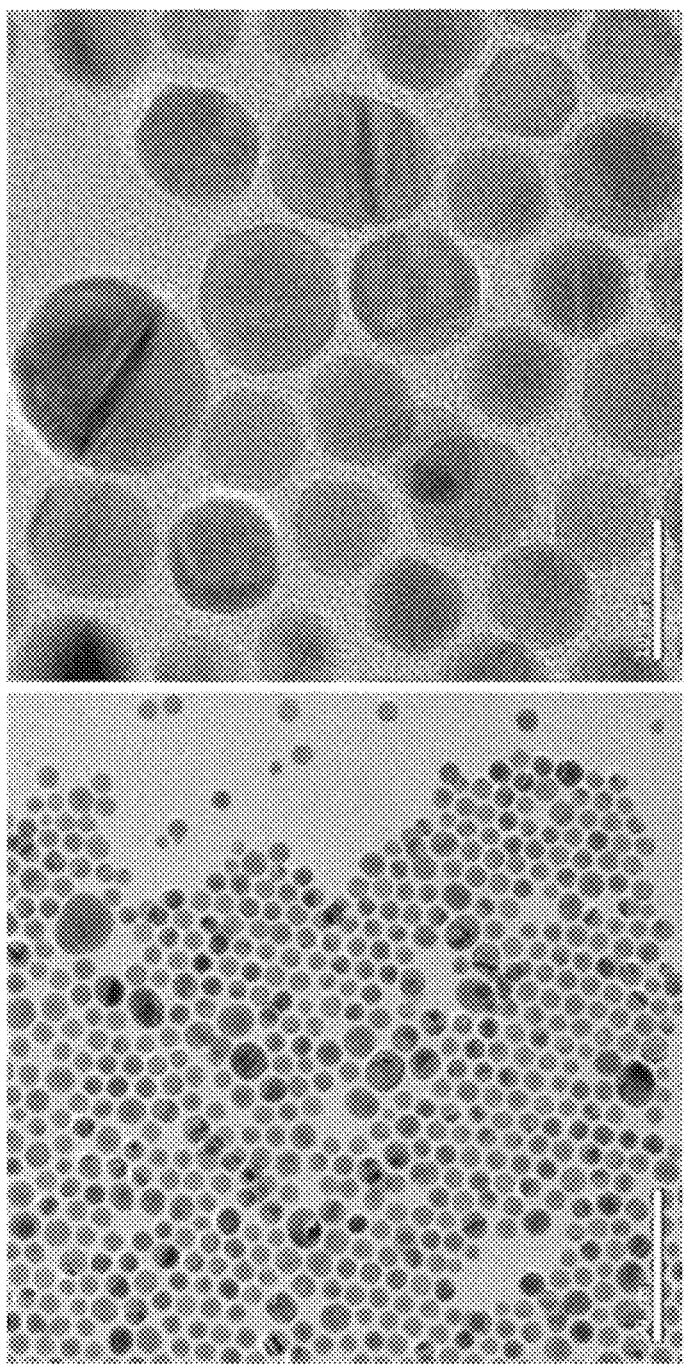
FIG. 9 and FIG. 10 show transmission electron microscopic images of the metal nanocrystals after the removal of the ligand by the heat-treating at a temperature of 100° C. and 140° C. in a comparative example, respectively.
Figure 10:
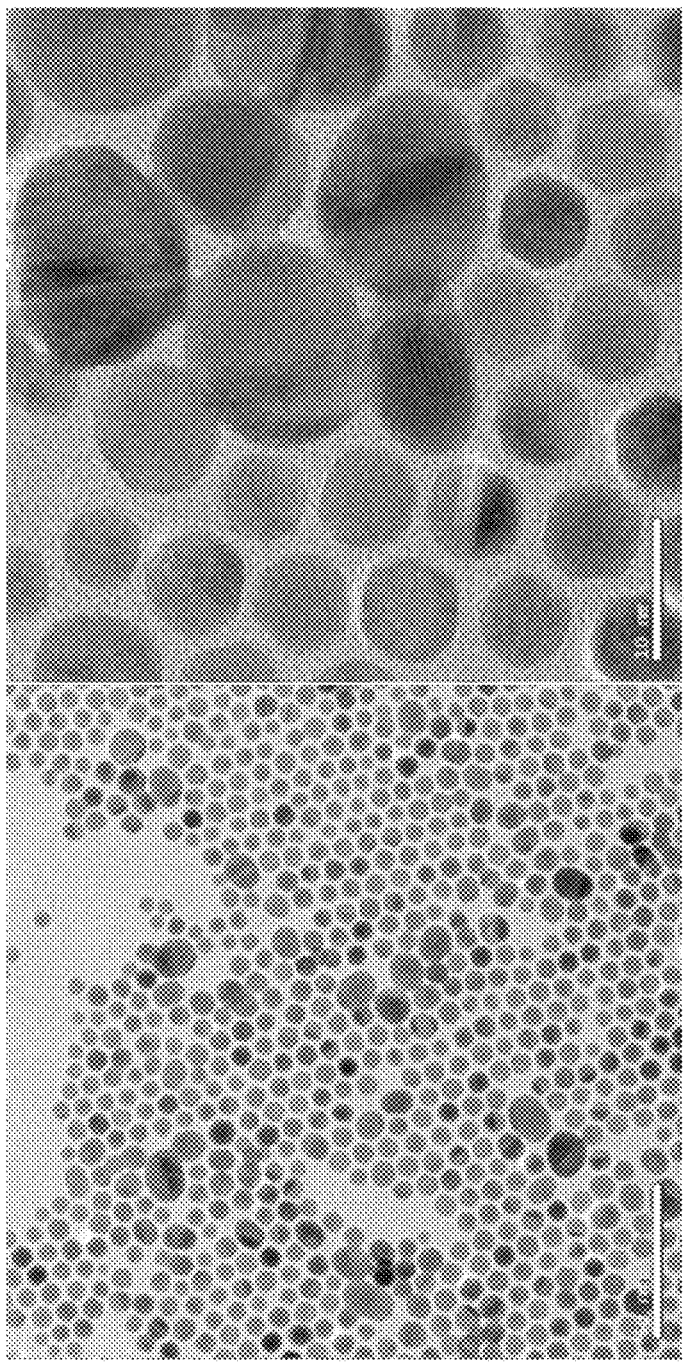

The nanoparticles prior to and after the treatment are subjected to transmission electron microscopic analysis using the same instrument as in Example 4, and the results are shown in FIG. 9 and FIG. 10. The results of FIG. 9 and FIG. 10 confirm that after the removal of the ligand, the distance between the gold nanoparticles is uniformly maintained, which implies that the ligand is not removed. The results also confirm that the heat-treating causes a growth of gold nanoparticles (i.e., substantial changes in the particle size).

The results of Example 4 and the comparative example confirm that when the method of the example is used to remove the ligand, the particles may show enhanced resistance against temperature (i.e., heat). In other words, even when the particle is treated at an identical temperature, the method of the example allows the ligand to be removed more easily without any deformation of the particle.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A method of removing an organic ligand from a surface of a particle comprising:
   obtaining a particle comprising an organic ligand disposed on a surface thereof;
   contacting the particle with an alkylammonium salt represented by Chemical Formula 1:

NR'$_4^+$A$^-$     Chemical Formula 1 wherein groups R' are the same or different and are each independently hydrogen or a C1 to C20 alkyl group, provided that at least one group R' is an alkyl group, and A is a hydroxide anion, a halide anion, a borohydride anion, a nitrate anion, a phosphate anion, or a sulfate anion; and
   heat-treating the particle to initiate and carry out a reaction between the alkylammonium salt and the organic ligand.

2. The method of claim 1, wherein the contacting the particle with an alkylammonium salt comprises
   dissolving the alkylammonium salt in a solvent to prepare a solution and
   applying the solution to the particle.

3. The method of claim 2, wherein the solvent comprises water, a C1 to C10 straight chain or branched alcohol, or a combination thereof.

4. The method of claim 1, wherein the particle is in a powder form, and the contacting the particle with an alkyl ammonium salt is carried out by spraying, adding by drops, or vaporizing the alkyl ammonium salt onto the particle in the powder form.

5. The method of claim 1, wherein the heat-treating of the particle is conducted by heating, light-irradiation, microwave-irradiation, or a combination thereof.

6. The method of claim 1, wherein the heat-treating of the particle comprises removing a reaction product of the alkyl ammonium salt and the organic ligand.

7. The method of claim 1, further comprising washing the heat-treated particle with a solvent.

8. The method of claim 1, wherein the particle comprises a metal, a semiconductor nanocrystal, a ceramic material, a carbon nanotube, graphene, or a combination thereof.

9. The method of claim 1, wherein the particle has a size of less than or equal to about 1 micrometer.

10. The method of claim 1, wherein the organic ligand comprises an organic compound comprising a reactive moiety that binds a surface of the particle and reacting with the alkylammonium compound.

11. The method of claim 10, wherein the organic ligand is at least one selected from RCOOH, RSH, R$_3$N, R$_2$NCOR, R$_3$P, R$_3$PO, R$_3$PS, R$_3$PSe, or ROH, wherein each group R is independently hydrogen, a C1 to C24 alkyl group, a C2 to C24 alkenyl group, or a C5 to C24 aryl group.

12. The method of claim 10, wherein the organic ligand comprises a polymeric compound, wherein a unit of the polymeric compound comprises a moiety that binds to the surface of the particle.

13. The method of claim 1, wherein the alkylammonium compound comprises a tetraalkyl ammonium hydroxide, a tetraalkyl ammonium halide, a tetraalkyl ammonium borohydride, a tetraalkyl ammonium nitrate, a tetraalkyl ammonium phosphate, a tetraalkyl ammonium sulfate, a tetraalkyl ammonium hydrogen sulfate, or a combination thereof.

14. The method of claim 1, wherein the heat-treating is carried out at a temperature of greater than or equal to about 80° C.

15. A method of producing a device, which comprises:
    obtaining a particle comprising an organic ligand disposed on a surface thereof;
    disposing the particle on a substrate;
    contacting the particle with an alkylammonium salt represented by Chemical Formula 1:

NR'$_4^+$A$^-$     Chemical Formula 1 wherein groups R' are the same or different and are each independently hydrogen or a C1 to C20 alkyl group provided that at least one group R' is an alkyl group, and A is a hydroxide anion, a halide anion, a borohydride anion, a nitrate anion, a phosphate anion, or a sulfate anion; and
    heat-treating the particle to initiate and carry out a reaction between the alkylammonium salt and the organic ligand.

16. The method of claim 15, wherein the contacting of the particle with the alkylammonium salt comprises dissolving the alkylammonium salt in a solvent to prepare a solution and applying the solution to the particle.

17. The method of claim 15, wherein the particle is in a powder form and the contacting of the particle with the alkyl ammonium salt is carried out by spraying, dropwise-addition, or vaporizing the alkyl ammonium salt onto the particle in the powder form.

18. The method of claim 15, wherein the contacting of the particle with the alkylammonium salt comprises selectively contacting a portion of the particles with the alkylammonium salt.

19. The method of claim 15, wherein the heat-treating of the particle comprises removing a reaction product of the alkyl ammonium salt and the organic ligand.

20. The method of claim 15, wherein the particle is a metal, a semiconductor nanocrystal, a ceramic material, a carbon nanotube, graphene, or a combination thereof.

21. The method of claim 15, wherein the particle has a size of less than or equal to about 1 micrometer.

22. The method of claim 15, wherein the organic ligand is at least one selected from RCOOH, RSH, R$_3$N, R$_2$NCOR, R$_3$P, R$_3$PO, R$_3$PS, R$_3$PSe, or ROH, wherein each group R is independently hydrogen, a C1 to C24 alkyl group, a C2 to C24 alkenyl group, or a C5 to C24 aryl group.

23. The method of claim 15, wherein the substrate comprises silicon, glass, a polymer, a metal oxide, a metal nitride, an organic-inorganic hybrid material, or a combination thereof.

24. The method of claim 15, wherein the substrate comprises a pattern of a conductive material formed on a surface thereof.

25. The method of claim 15, wherein the alkylammonium compound comprises a tetraalkyl ammonium hydroxide, a tetraalkyl ammonium halide, a tetraalkyl ammonium borohydride, a tetraalkyl ammonium nitrate, a tetraalkyl ammonium phosphate, a tetraalkyl ammonium sulfate, a tetraalkyl ammonium hydrogen sulfate, or a combination thereof.

* * * * *